United States Patent
Shan et al.

(10) Patent No.: US 11,119,536 B2
(45) Date of Patent: Sep. 14, 2021

(54) FLEXIBLE ELECTRONIC DEVICE AND MANUFACTURING METHOD THEREFOR

(71) Applicants: KUNSHAN NEW FLAT PANEL DISPLAY TECHNOLOGY CENTER CO., LTD., KunShan (CN); KUNSHAN GO-VISIONOX OPTO-ELECTRONICS CO., LTD., KunShan (CN)

(72) Inventors: Qi Shan, KunShan (CN); Kun Hu, KunShan (CN); Li Lin, KunShan (CN); Shixing Cai, KunShan (CN); Shengfang Liu, KunShan (CN)

(73) Assignees: KUNSHAN NEW FLAT PANEL DISPLAY TECHNOLOGY CENTER CO., LTD., Jiangsu (CN); KUNSHAN GO-VISIONOX OPTO-ELECTRONICS CO., LTD., Jiangsu (CN)

(*) Notice: Subject to any disclaimer, the term of this patent is extended or adjusted under 35 U.S.C. 154(b) by 562 days.

(21) Appl. No.: 15/778,481

(22) PCT Filed: Mar. 9, 2017

(86) PCT No.: PCT/CN2017/076100
§ 371 (c)(1),
(2) Date: May 23, 2018

(87) PCT Pub. No.: WO2017/157215
PCT Pub. Date: Sep. 21, 2017

(65) Prior Publication Data
US 2018/0341291 A1    Nov. 29, 2018

(30) Foreign Application Priority Data
Mar. 16, 2016 (CN) .......................... 201610150011.7

(51) Int. Cl.
*G06F 1/16*    (2006.01)
*G09F 9/30*    (2006.01)
(Continued)

(52) U.S. Cl.
CPC ...... *G06F 1/1652* (2013.01); *G02F 1/133305* (2013.01); *G09F 9/30* (2013.01);
(Continued)

(58) Field of Classification Search
None
See application file for complete search history.

(56) References Cited

U.S. PATENT DOCUMENTS 10,756,310 B2 *  8/2020  Nakamura .......... H01L 27/3218
2007/0018170 A1 *  1/2007  Jeong ................ H01L 29/78603
257/72
(Continued)

FOREIGN PATENT DOCUMENTS

CN    1578586 A    2/2005
CN    1901206 A    1/2007
(Continued)

*Primary Examiner* — Phu Vu
(74) *Attorney, Agent, or Firm* — Muncy, Geissler, Olds & Lowe, P.C.

(57) ABSTRACT

Provided are a flexible electronic device and a manufacturing method thereof. The flexible electronic device (200) comprises a flexible substrate (210) and a device layer formed on the flexible substrate (210). The device layer comprises a semiconductor structure (220) and a wire structure (230) connected to the semiconductor structure, the wire structure (230) having an extension direction same to a channel direction of the semiconductor structure (220). The extension direction of the first wire structure (230) forms an included angle smaller than 90° with respect to a stretching direction of the flexible substrate (210). In the flexible electronic device (200) and manufacturing method thereof of the present invention, the channel direction of the semi-
(Continued)

conductor structure (220) and the extension direction of the first wire structure (230) are adjusted, such that the semiconductor structure (220) and the first wire structure (230) are least affected by a stress, thus ensuring electrical property and flexibility of the flexible electronic device (200).

10 Claims, 4 Drawing Sheets

(51) Int. Cl.
*G02F 1/1333* (2006.01)
*H01L 27/12* (2006.01)
*H01L 51/00* (2006.01)

(52) U.S. Cl.
CPC .............. *G09F 9/301* (2013.01); *H01L 27/12* (2013.01); *H01L 51/0097* (2013.01)

(56) References Cited

U.S. PATENT DOCUMENTS

| | | | |
|---|---|---|---|
| 2015/0123137 A1 | 5/2015 | Kwon et al. | |
| 2015/0302811 A1 | 10/2015 | Park | |
| 2015/0357395 A1 | 12/2015 | Cheon et al. | |
| 2016/0126295 A1* | 5/2016 | Sato | H01L 27/3213 257/89 |
| 2016/0174304 A1* | 6/2016 | Kim | H01L 51/5253 313/511 |
| 2017/0091903 A1* | 3/2017 | Jo | G06T 3/4069 |

FOREIGN PATENT DOCUMENTS

| | | |
|---|---|---|
| CN | 1901206 A | 1/2007 |
| CN | 102169960 A | 8/2011 |
| CN | 102412157 A | 4/2012 |
| CN | 104091891 A | 10/2014 |
| CN | 105074802 A | 11/2015 |
| JP | 2005057259 A | 3/2005 |
| JP | 2007025620 A | 2/2007 |
| JP | 2007073800 A | 3/2007 |
| JP | 2009259929 A | 11/2009 |
| KR | 10-2007-0010938 A | 1/2007 |
| KR | 100923597 B1 | 10/2009 |
| KR | 10-2012-0079318 A | 7/2012 |
| KR | 20150052641 A | 5/2015 |

* cited by examiner

FLEXIBLE ELECTRONIC DEVICE AND MANUFACTURING METHOD THEREFOR

TECHNICAL FIELD

The present invention relates to the field of flexible electronics, and in particular, to a flexible electronic device and a manufacturing method thereof.

BACKGROUND

Flexible electronics is an electronic technology based on a flexible substrate. Due to its unique flexibility and extensibility, this technology has broad application prospects in fields such as information, energy, medical care, and national defense. Flexible electronic devices fabricated using flexible electronics technology are light and thin, and can be bent or crimped into any shape, and include, for example, flexible printed circuit boards, flexible chips, and flexible displays.

A conventional flexible electronic device generally includes a flexible substrate and a device layer fabricated on the flexible substrate. The device layer includes a semiconductor structure and a wire structure. The semiconductor structure functions as a switch, and the wire structure is used electrically connect to other devices. Part of the wire structure extends in a direction parallel to a channel direction of the semiconductor structure, in order to match up with the semiconductor structure.

Please refer to FIG. 1, which is a schematic structural diagram of a flexible electronic device in the prior art. As shown FIG. 1, a conventional flexible electronic device 100 includes a flexible substrate 110 and a device layer formed on the flexible substrate 110. The device layer includes a semiconductor structure 120 and a wire structure 130 matching up with the semiconductor structure 120, where an extending direction of the wire structure 130 is parallel to a channel direction (shown by a bidirectional dotted arrow) of the semiconductor structure 120.

When the flexible electronic device 100 is bent, the flexible substrate 110 and the device layer are both affected by a stress. Please refer to FIG. 2, which is a schematic structural diagram of the flexible electronic device subjected to the stress in the prior art. As shown in FIG. 2, when a direction of the stress applied on the flexible electronic device 100 is parallel to the channel direction of the semiconductor structure 120, the semiconductor structure 120 is subjected to a tension force along the channel direction and a contraction force perpendicular to the tension direction. The semiconductor structure 120 deforms under the effect of the two forces, resulting in a change in a current flowing through the semiconductor structure 120. Moreover, because the extending direction of the wire structure 130 is the same as the stress direction, the wire structure 130 after being tensioned becomes thinner and longer and thus is easily broken.

It can be known from the above that, the semiconductor structure 120 and the wire structure 130 of the conventional flexible electronic product 10 may change in structure under the effect of a stress, which may result in deterioration of the electrical property and flexibility of the device layer 100.

SUMMARY OF THE INVENTION

An objective of the present invention is to provide a flexible electronic device and a manufacturing method thereof, so as to solve the problem that the electrical property and flexibility of the conventional flexible electronic device are reduced under the effect of the stress.

To solve the foregoing technical problem, the present invention provides a flexible electronic device, which comprises a flexible substrate and a device layer formed on the flexible substrate.

The device layer comprises a semiconductor structure and a first wire structure connected to the semiconductor structure, the first wire structure having an extending direction same to a channel direction of the semiconductor structure.

The extending direction of the first wire structure forms an included angle smaller than 90° with respect to a stretching direction of the flexible substrate.

Alternatively, in the flexible electronic device, the included angle formed between the extending direction of the first wire structure and the stretching direction of the flexible substrate ranges from 40° to 70°.

Alternatively, in the flexible electronic device, the device layer further comprises a second wire structure provided on an edge of the flexible substrate, the second wire structure having an extending direction parallel to an edge line of the flexible substrate.

Alternatively, in the flexible electronic device, the second wire structure defines a plurality of through holes, wherein the through hole being formed in a parallelogram shape with a diagonal line thereof extending along a direction same to the stretching direction of the flexible substrate.

Alternatively, in the flexible electronic device, the flexible electronic device is a flexible flat panel display device having a plurality of pixel units, a boundary of the pixel unit being formed in a parallelogram shape with a diagonal line thereof extending along a direction same to the stretching direction of the flexible substrate.

Alternatively, in the flexible electronic device, an included angle formed between a side edge of the parallelogram shape and the diagonal line of the parallelogram shape ranges from 40° to 70°.

Alternatively, in the flexible electronic device, the flexible electronic device is a flexible liquid crystal display.

Alternatively, in the flexible electronic device, the flexible electronic device is a flexible organic light-emitting display.

Accordingly, the present invention also provides a method for manufacturing a flexible electronic device, which comprises:

providing a flexible substrate; and respectively forming a semiconductor structure and a wire structure on the flexible substrate, wherein the semiconductor structure has a channel direction same to an extending direction of the wire structure, and the channel direction of the semiconductor structure forms an included angle smaller than 90° with respect a stretching direction of the flexible substrate.

Accordingly, the present invention also provides a method for manufacturing a flexible electronic device, which comprises:

providing a flexible substrate; and respectively forming a plurality of pixel units, a first wire structure and a second wire structure on the flexible substrate, wherein the pixel unit has a semiconductor structure, the semiconductor structure having a channel direction same to an extending direction of the first wire structure and the channel direction of the semiconductor structure forming an included angle smaller than 90° with respect to a stretching direction of the flexible substrate.

The second wire structure is provided on an edge of the flexible substrate, and the second wire structure has an extending direction parallel to an edge line of the flexible substrate. The second wire structure defines a plurality of through holes, wherein the through hole is formed in a parallelogram shape, and a diagonal line of the parallelogram shape extends along a direction same to the stretching direction of the flexible substrate.

In the flexible electronic device and the manufacturing method thereof according to the embodiments of the present invention, the channel direction of the semiconductor structure and the extending direction of the first wire structure are adjusted, such that the semiconductor structure and the first wire structure are least affected by a stress, thus ensuring the electrical property and flexibility of the flexible electronic device.

DETAILED DESCRIPTION

A flexible electronic device and a manufacturing method thereof according to the present invention will be further described in detail below with reference to the accompanying drawings and specific embodiments. The advantages and features of the present invention will be clearer according to the following description and claims. It should be noted that, the accompanying drawings are all shown in very simplified forms and imprecise scales, and are only used for easy and clear explanation of the embodiments of the present invention.

Embodiment 1

Figure 1:
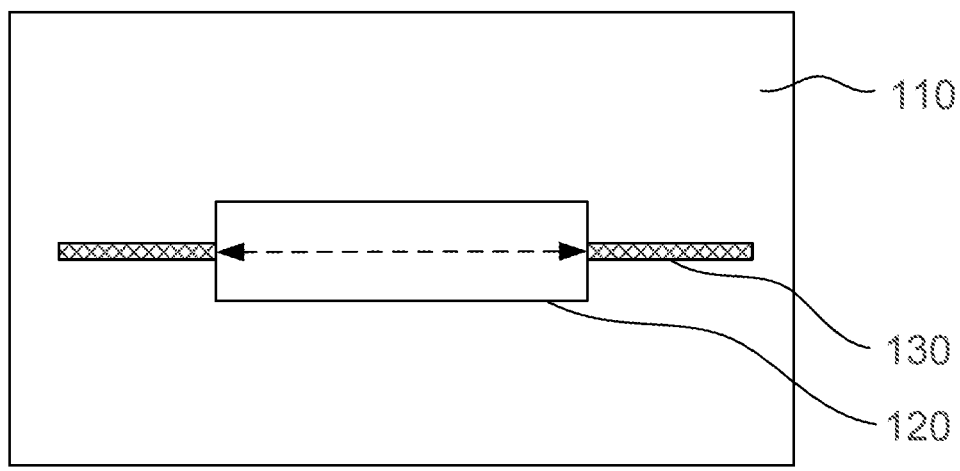
FIG. 1 is a schematic structural diagram of a flexible electronic device in the prior art.
Figure 2:
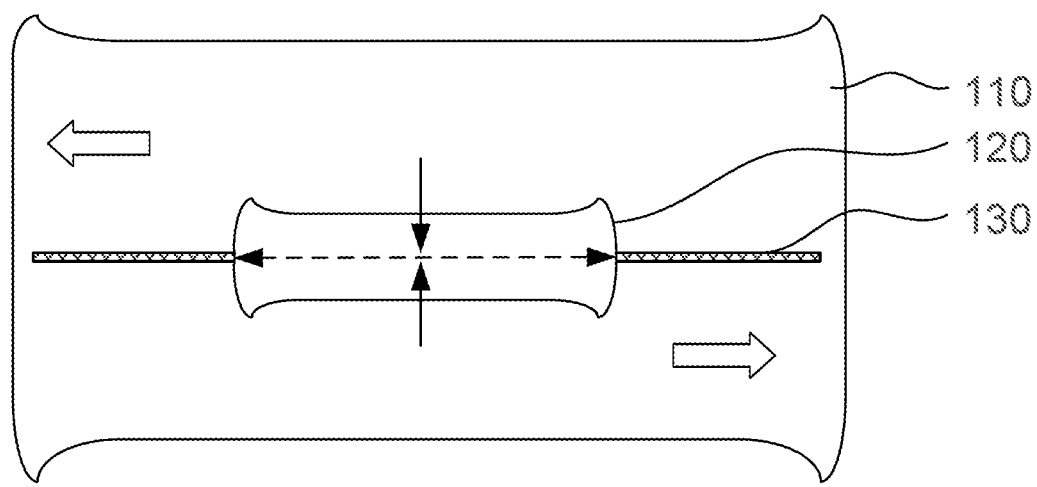
FIG. 2 is a schematic structural diagram of the flexible electronic device subjected to a stress in the prior art.
Figure 3:
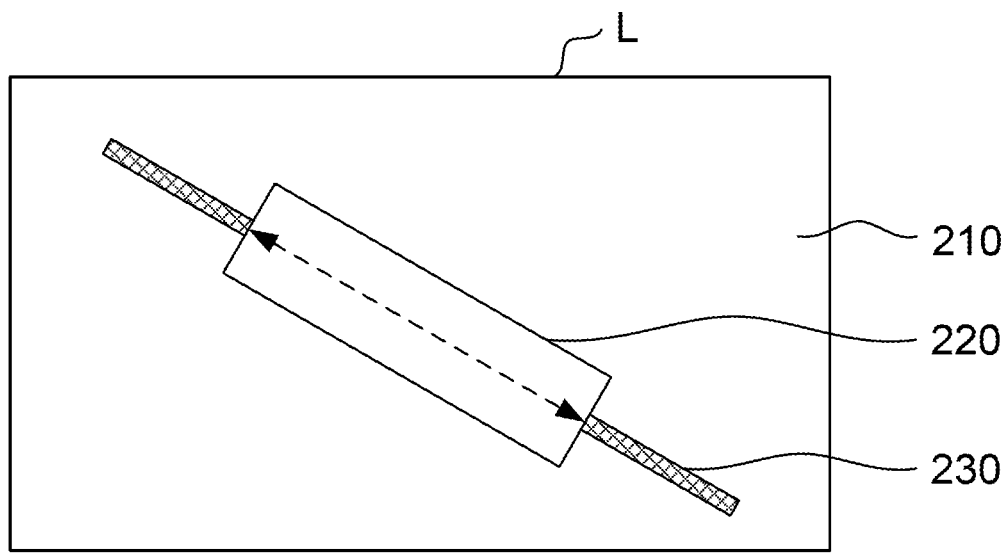
FIG. 3 is a schematic structural diagram of a flexible electronic device in Embodiment 1 of the present invention.

Please refer to FIG. 3, which is a schematic structural diagram of a flexible electronic device in an embodiment of the present invention. As shown in FIG. 3, the flexible electronic device 200 comprises a flexible substrate 210 and a device layer formed on the flexible substrate 210. The device layer comprises a semiconductor structure 220 and a first wire structure 230 that are mutually connected, an extending direction of the first wire structure 230 being same to a channel direction of the semiconductor structure 220. The extending direction of the first wire structure 230 forms an included angle smaller than 90° with respect to a stretching direction of the flexible substrate 210. The semiconductor structure in the embodiment of the present invention is a thin film transistor structure, and specifically includes a gate, a drain (not shown in the figure), and a channel.

Specifically, in the flexible electronic device 200, the device layer comprises the semiconductor structure 220 and the first wire structure 230 that are mutually connected. The semiconductor structure 220 functions as a switch. The wire structure 230 matches up with the semiconductor structure 220, and is used to form electrical connection to other devices. As shown in FIG. 3, the channel direction (shown by a bidirectional dotted arrow) of the semiconductor structure 220 is parallel to the extending direction of the first wire structure 230.

Moreover, the extending direction of the first wire structure 230 is neither parallel nor perpendicular to an extending direction of an edge line L of the flexible substrate 210. That is, the extending direction of the first wire structure 230 forms an included angle smaller than 90° with respect to the stretching direction (same to the extending direction of the edge line L) of the flexible substrate 210.

Preferably, the included angle formed between the extending direction of the first wire structure 230 and the stretching direction of the flexible substrate 210 ranges from 40° to 70°. For example, the extending direction of the first wire structure 230 and the stretching direction of the flexible substrate 210 form an included angle of 45°, 50°, 55°, 60°, or 65°.

Figure 4:
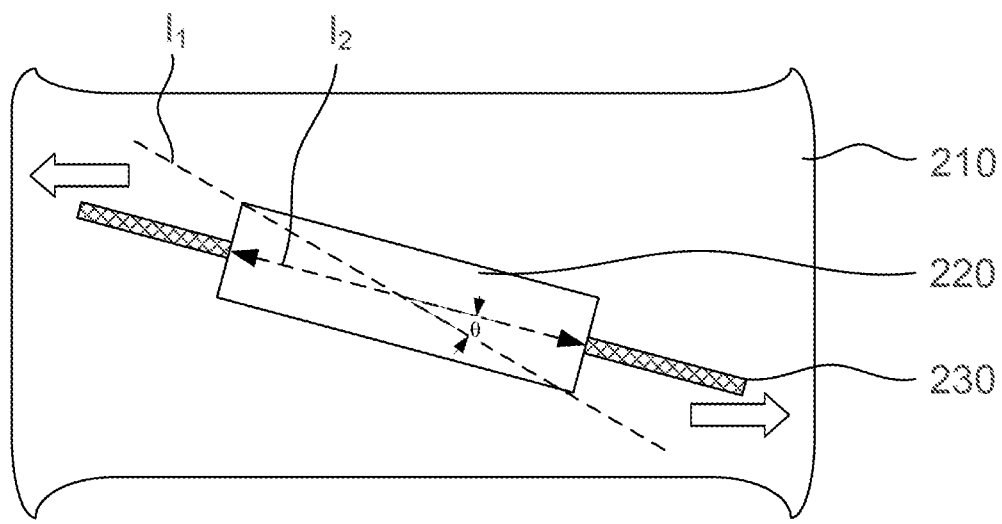
FIG. 4 is a schematic structural diagram of the flexible electronic device subjected to a stress in an embodiment of the present invention.

Please refer to FIG. 4, which is a schematic structural diagram of the flexible electronic device subjected to a stress in an embodiment of the present invention. As shown in FIG. 4, when the flexible electronic device 200 is bent under a force, the channel direction (shown by the bidirectional dotted arrow) of the semiconductor structure 220 and the extending direction of the first wire structure 230 are inconsistent with a direction (shown by the hollow arrows) of force applied on the flexible substrate 210, that is, an included angle exists between the extending direction of the first wire structure 230 and the direction of force applied on the flexible substrate 210. Therefore, it can be found by comparing FIG. 3 with FIG. 4 that, the semiconductor structure 220 and the first wire structure 230 only rotate (from an original position $l_1$ without the stress in FIG. 3 to a new position $l_2$ with the stress) by an angle of θ, but do not deform. No deformation means that the semiconductor structure 220 and the first wire structure 230 are subjected to the smallest stress in this case, and the electrical property and flexibility of the flexible electronic device 200 remain optimal.

In the conventional flexible electronic device 100, the channel direction of the semiconductor structure and the extending direction of the wire structure are both same to the direction of force applied on the flexible substrate (that is, an angle of 0° is formed). In contrast, in this embodiment, the channel direction of the semiconductor structure 220 and the extending direction of the first wire structure 230 are inconsistent with the direction of force applied on the flexible substrate 210, such that an included angle is formed.

A tensile test is conducted for the conventional flexible electronic device 100 and the flexible electronic device 200 according to this embodiment respectively using the same stress. The tests show that, compared with the conventional flexible electronic device 100, the flexible electronic device 200 according to this embodiment is subjected to a smaller maximum stress, and a distribution area of the maximum stress is very small.

As can be seen, the semiconductor structure 220 and the first wire structure 230 in the flexible electronic device 200 according to this embodiment are subjected to a relatively small stress, and thus the stress does not substantially affect the electrical property and flexibility of the flexible electronic device 200. Therefore, compared with the conventional flexible electronic device 100, the flexible electronic device 200 has better electrical property and flexibility.

Accordingly, this embodiment further provides a method of manufacturing a flexible electronic device. Referring to FIG. 3 continuously, the method of manufacturing a flexible electronic device comprises:

step 1: providing a flexible substrate 210; and step 2: respectively forming a semiconductor structure 220 and a first wire structure 230 on the flexible substrate 210 by graphic process, wherein a channel direction of the semiconductor structure 220 is same to an extending direction of the first wire structure 230, and forms an included angle smaller than 90° with respect to a stretching direction (that is, an extending direction of an edge line L) of the flexible substrate 210.

Specifically, the flexible substrate 210 is first provided, which is usually a transparent plastic substrate.

Next, the semiconductor structure 220 and the first wire structure 230 are respectively formed on the flexible substrate 210. The semiconductor structure 220 and the first wire structure 230 are both formed using a patterning process. A long-side direction (that is, the channel direction) of a semiconductor thin film pattern fabricated using the patterning process is parallel to an extending direction of a wire thin film pattern, and forms an included angle of 60° with respect to the stretching direction (shown by the hollow arrows in FIG. 4) of the flexible substrate 210.

In this way, the flexible electronic device 200 is formed. A device layer of the flexible electronic device 200 includes the semiconductor structure 220 and the first wire structure 230. The channel direction of the semiconductor structure 220 is same to the extending direction of the first wire structure 230, and forms an included angle smaller than 90° with respect to the stretching direction of the flexible substrate 210.

Embodiment 2

Figure 5:
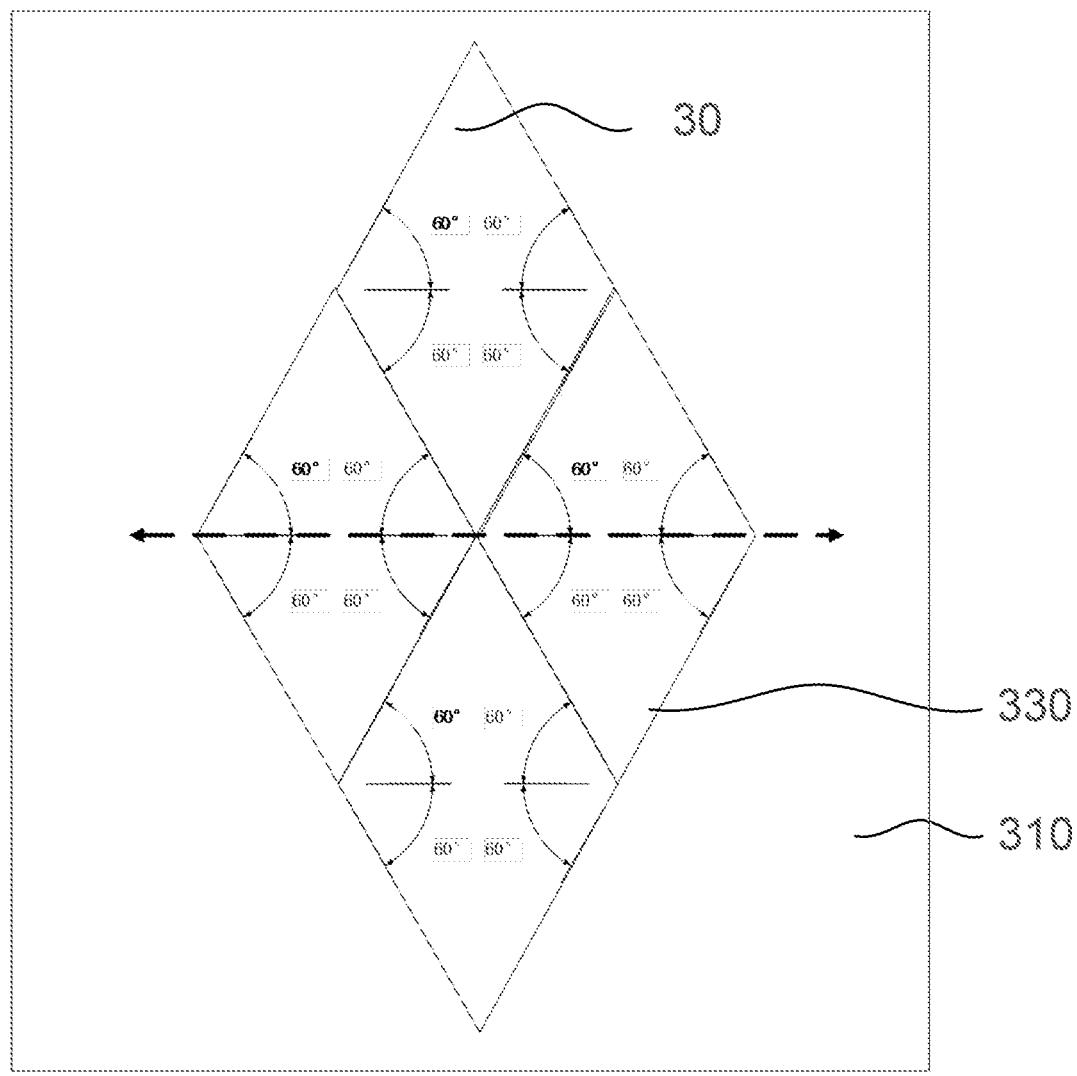
FIG. 5 is a schematic structural diagram of a flexible electronic device in Embodiment 2 of the present invention.

Please refer to FIG. 5, which is a schematic structural diagram of a flexible electronic device in Embodiment 2 of the present invention. As shown in FIG. 5, the flexible electronic device 300 comprises a flexible substrate 310 and a device layer 330 formed on the flexible substrate 310. The device layer 330 comprises semiconductor structures (not shown in the figure) and first wire structures (not shown in the figure) that are mutually connected, an extending direction of the first wire structures being same to a channel direction of the semiconductor structures. The extending direction of the first wire structures forms an included angle smaller than 90° with respect to a stretching direction of the flexible substrate 310.

Specifically, in the flexible electronic device 300, the device layer 330 comprises a plurality of pixel units 30 and first wire structures. The plurality of pixel units 30 are arranged in an array, and each pixel unit 30 has a semiconductor structure (not shown in the figure) that functions as a switch. The first wire structures match up with the semiconductor structures, and are used to form electrical connections to other devices. The extending direction of the first wire structures is same to the channel direction of the semiconductor structures.

The extending direction of the first wire structures is neither parallel nor perpendicular to an edge line L of the flexible substrate 310. That is, the extending direction of the first wire structures is neither parallel nor perpendicular to the stretching direction of the flexible substrate 310, with an included angle smaller than 90° being aimed therebetween. Therefore, when the flexible substrate 310 is tensioned, the first wire structure and the semiconductor structure are subjected to a relatively small stress. The semiconductor structure and the first wire structure only rotate by an angle, but do not deform.

In this embodiment, a pattern of a boundary of the pixel unit 30 is a parallelogram, and one diagonal line of the parallelogram extending along a direction same to the stretching direction (shown by the bidirectional dotted arrow) of the flexible substrate 310.

Preferably, an included angle formed between a side edge of the parallelogram shape and the diagonal line of the parallelogram shape ranges from 40° to 70°. In this embodiment, the included angle formed between a side edge of the parallelogram shape and the diagonal line of the parallelogram shape equals to 60°.

The device layer 330 further comprises second wire structures (not shown in the figure), wherein the second wire structures are provided on an edge of the flexible substrate 310, and an extending direction of the second wire structures is parallel to an edge line of the flexible substrate 310.

Figure 6:
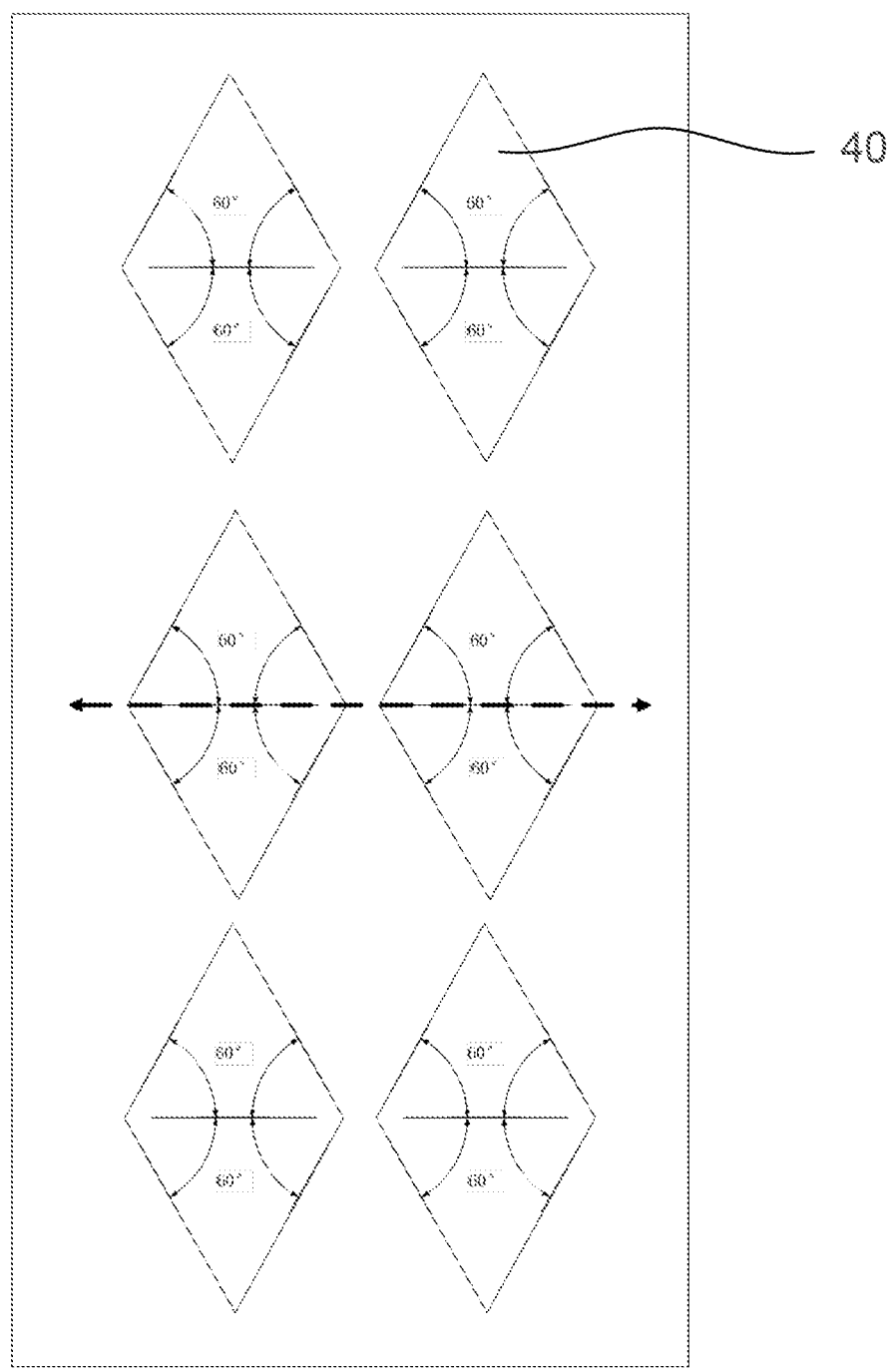
FIG. 6 is a schematic structural diagram of a second wire structure in Embodiment 2 of the present invention.

Also referring to FIG. 5 and FIG. 6, the second wire structures define a plurality of through holes 40, and evenly arranged along the extending direction of the second wire structures. Each through hole 40 may be of a parallelogram shape, and a diagonal line of the parallelogram extends along a direction same to the stretching direction (shown by the bidirectional dotted arrow) of the flexible substrate 310.

The extending direction of the second wire structures must be parallel or perpendicular to the stretching direction of the flexible substrate 310. Therefore, the parallelogram-shaped through holes are arranged on the extending direction of the second wire structures, thus effectively preventing an externally applied stress from concentrating on the wires, and improving flexibility of the second wire structures.

Preferably, an included angle formed between a side edge of the parallelogram shape and the diagonal line of the parallelogram shape ranges from 40° to 70°. In this embodiment, the included angle formed between a side edge of the parallelogram shape and the diagonal line of the parallelogram shape is 60°.

In this embodiment, the flexible electronic device 300 is a flexible flat panel display device. Those of skill in the art will recognize that, the present invention does not particularly specify the type of the flexible flat panel display device, which may be a flexible LCD, a flexible OLED, or a flexible flat panel display device of another type.

Accordingly, this embodiment further provides a method of manufacturing a flexible electronic device. Continuously referring to FIG. 3, the method of manufacturing a flexible electronic device comprises:

step 1: providing a flexible substrate 310; and step 2: respectively forming a plurality of pixel units 30 and first wire structures on the flexible substrate 310, wherein each pixel unit 30 has a semiconductor structure, a channel direction of the semiconductor structure being same to an extending direction of the first wire structures and forming an included angle smaller than 90° with respect to a stretching direction of the flexible substrate 310.

Specifically, the flexible substrate 310 is firstly provided, which is usually a transparent plastic substrate.

Next, the plurality of pixel units 30, which are arranged in an array, and the first wire structures are respectively formed on the flexible substrate 310. Each pixel unit 30 has a semiconductor structure. The semiconductor structure and the first wire structure 230 are both formed using a patterning process. A long-side direction (that is, the channel direction) of a semiconductor thin film pattern fabricated using the patterning process is parallel to an extending direction of a wire thin film pattern, and forms an included angle of 60° with respect to the stretching direction of the flexible substrate 310.

During a process of forming a device layer on the flexible substrate 310, second wire structures are also formed on the flexible substrate 310 using the patterning process. The second wire structures are provided on edges of the flexible substrate. An extending direction of the second wire structure is parallel to an edge line of the flexible substrate. The second wire structures defines a plurality of through holes. The through hole is of a parallelogram shape, and a diagonal line of the parallelogram extends along a direction same to the stretching direction of the flexible substrate.

In this way, the flexible electronic device 300 is formed. The device layer of the flexible electronic device 300 comprises the semiconductor structures, the first wire structures and the second wire structures. The channel direction of the semiconductor structures is same to the extending direction of the first wire structures, and forms an included angle smaller than 90° with respect to the stretching direction of the flexible substrate 310. The extending direction of the second wire structures is either parallel or perpendicular to the stretching direction of the flexible substrate 310. Parallelogram-shaped through holes that can reduce the effect of a stress are provided on the second wire structures.

To sum up, in the flexible electronic device and the manufacturing method thereof according to the embodiments of the present invention, the channel direction of the semiconductor structure and the extending direction of the first wire structure are adjusted, such that the semiconductor structure and the first wire structure are least affected by a stress, thus ensuring the electrical property and flexibility of the flexible electronic device.

The above merely describes the preferred embodiments of the present invention and is not intended to limit the scope of the present invention. Any changes and modifications made by persons of ordinary skill in the art according to the above disclosure all fall within the protection scope of the claims.

What is claimed is:

1. A flexible electronic device, comprising: a flexible substrate and a device layer formed on the flexible substrate, wherein:
   the device layer comprises a semiconductor structure and a first wire structure connected to the semiconductor structure, the first wire structure extending along an extending direction same to a channel direction of the semiconductor structure;
   the extending direction of the first wire structure forms an included angle smaller than 90° with respect to a stretching direction of the flexible substrate;
   the semiconductor structure is a thin film transistor including a gate, a drain, and a channel, and the first wire structure matches up with the semiconductor structure to form an electrical connection to a device; and
   a second wire structure provided on an edge of the flexible substrate, the second wire structure extending along an extending direction parallel to an edge line of the flexible substrate, a plurality of through holes having borders respectively spaced and being formed in the second wire structure, each of the through holes having a parallelogram shape with a diagonal line of the parallelogram extending along a direction same to the stretching direction of the flexible substrate.

2. The flexible electronic device of claim 1, wherein the included angle ranges from 40° to 70°.

3. The flexible electronic device of claim 1, wherein the flexible electronic device is a flexible flat panel display device, the device layer having a plurality of pixel units, a boundary of the pixel unit being formed in a parallelogram shape with a diagonal line thereof extending along a direction same to the stretching direction of the flexible substrate.

4. The flexible electronic device of claim 3, wherein an included angle formed between a side edge of the parallelogram shape and the corresponding diagonal line of the parallelogram shape ranges from 40° to 70°.

5. The flexible electronic device of claim 3, wherein the flexible electronic device is a flexible liquid crystal display.

6. The flexible electronic device of claim 3, wherein the flexible electronic device is a flexible organic light-emitting display.

7. A method for manufacturing a flexible electronic device, comprising:
   providing a flexible substrate; and
   respectively forming a semiconductor structure and a first wire structure on the flexible substrate, wherein the semiconductor structure has a channel direction same to an extending direction of the first wire structure, the channel direction of the semiconductor structure forms an included angle smaller than 90° with respect to a stretching direction of the flexible substrate, wherein the semiconductor structure is a thin film transistor including a gate, a drain, and a channel, and the first wire structure matches up with the semiconductor structure to form an electrical connection to a device and wherein the device layer further comprises a second wire structure provided on an edge of the flexible substrate, the second wire structure extending along an extending direction parallel to an edge line of the flexible substrate; and a plurality of through holes having borders respectively spaced and being formed in the second wire structure, each of the through holes having a parallelogram shape with a diagonal line of the parallelogram extending along a direction same to the stretching direction of the flexible substrate.

8. A method for manufacturing a flexible electronic device, comprising:
   providing a flexible substrate;
   respectively forming a plurality of pixel units, a first wire structure and a second wire structure on the flexible substrate, the pixel unit having a semiconductor structure, the semiconductor structure having a channel direction same to an extending direction of the first wire structures, the channel direction of the semiconductor structure forming an included angle smaller than 90° with respect to a stretching direction of the flexible substrate;
   providing the second wire structure on an edge of the flexible substrate, the second wire structure extending along an extending direction parallel to an edge line of the flexible substrate; and
   forming a plurality of through holes in the second wire structure, the through holes each having a parallelogram shape with a diagonal line of the parallelogram extending along a direction same to the stretching direction of the flexible substrate, wherein the plurality of holes having borders respectively spaced,
   the semiconductor structure is a thin film transistor including a gate, a drain, and a channel, and the first wire structure matches up with the semiconductor structure to form an electrical connection to a device.

9. The flexible electronic device of claim 4, wherein the included angle formed between a side edge of the parallelogram shape and the corresponding diagonal line of the parallelogram shape is substantially 60°.

10. The method of claim 7, wherein the forming of a semiconductor structure and a first wire structure on the flexible substrate comprises forming a semiconductor structure and a first wire structure on the flexible substrate by graphic process.

* * * * *